(12) United States Patent
Porter et al.

(10) Patent No.: US 7,915,742 B2
(45) Date of Patent: Mar. 29, 2011

(54) DETERMINING THE PLACEMENT OF SEMICONDUCTOR COMPONENTS ON AN INTEGRATED CIRCUIT

(75) Inventors: Howard L. Porter, Loveland, CO (US); Richard S. Rodgers, Fort Collins, CO (US); Troy H. Frerichs, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 292 days.

(21) Appl. No.: 12/111,536

(22) Filed: Apr. 29, 2008

(65) Prior Publication Data

US 2008/0230900 A1 Sep. 25, 2008

Related U.S. Application Data

(62) Division of application No. 11/189,227, filed on Jul. 26, 2005, now Pat. No. 7,386,824.

(51) Int. Cl.
*H01L 23/52* (2006.01)
*H01L 23/48* (2006.01)
*H01L 29/40* (2006.01)

(52) U.S. Cl. ............... 257/781; 257/E23.115; 257/737; 257/778; 257/780; 438/614

(58) Field of Classification Search ........... 257/E23.069, 257/E23.115, 776, 778–783, 785, 737; 716/1, 716/6, 8–10, 12, 19; 438/108, 612, 614
See application file for complete search history.

(56) References Cited

U.S. PATENT DOCUMENTS

| | | | |
|---|---|---|---|
| 4,679,171 A | 7/1987 | Logwood et al. | |
| 4,887,236 A | 12/1989 | Schloemann | |
| 5,594,262 A | 1/1997 | Lee et al. | |
| 5,886,375 A | 3/1999 | Sun | |
| 5,898,223 A * | 4/1999 | Frye et al. | 257/777 |
| 5,999,440 A | 12/1999 | Crafts | |
| 6,043,429 A | 3/2000 | Blish, II et al. | |
| 6,329,712 B1 | 12/2001 | Akram et al. | |
| 6,436,737 B1 | 8/2002 | Malladi | |
| 6,483,134 B1 | 11/2002 | Weatherford et al. | |
| 6,504,256 B2 * | 1/2003 | Shah et al. | 257/778 |
| 6,507,511 B1 | 1/2003 | Barth, Jr. et al. | |
| 6,531,759 B2 | 3/2003 | Wachnik et al. | |
| 6,538,334 B2 | 3/2003 | Akram et al. | |
| 6,548,392 B2 * | 4/2003 | Akram et al. | 438/612 |
| 6,693,820 B2 | 2/2004 | Nii et al. | |
| 6,724,676 B1 | 4/2004 | Schneider et al. | |
| 6,744,661 B1 | 6/2004 | Shubat | |
| 6,762,506 B2 * | 7/2004 | Amagai et al. | 257/786 |

(Continued)

OTHER PUBLICATIONS

Frye, Robert C., "Design Issues for Flip-Chip IC's in Multilayer Packages", *IEEE* 1997.

*Primary Examiner* — Chris Chu

(57) ABSTRACT

Systems and methods are disclosed herein for determining the placement of a standard cell, representing a semiconductor component in a design stage, on an integrated circuit die. One embodiment of a method, among others, comprises analyzing regions of a semiconductor die with respect to the susceptibility of the region to be exposed to radiation. This method further comprises placing the standard cell in one of the analyzed regions of the semiconductor die, the standard cell being placed based on the sensitivity of the standard cell to radiation. The method may also comprise running an algorithm, e.g. using a component placement engine, for determining the placement of semiconductor components on an integrated circuit die.

10 Claims, 3 Drawing Sheets

U.S. PATENT DOCUMENTS

| | | |
|---|---|---|
| 6,785,847 B1 | 8/2004 | Jordan et al. |
| 6,891,743 B2 | 5/2005 | Ohbayashi et al. |
| 7,081,635 B2 * | 7/2006 | Baumann .................. 250/493.1 |
| 7,221,053 B2 * | 5/2007 | Meyer et al. .................. 257/737 |
| 7,294,928 B2 * | 11/2007 | Bang et al. .................... 257/737 |
| 7,386,824 B2 * | 6/2008 | Porter et al. .................... 716/10 |
| 7,451,418 B2 * | 11/2008 | Porter et al. ...................... 716/6 |
| 7,550,856 B2 * | 6/2009 | Libres et al. .................. 257/777 |
| 2004/0063288 A1 | 4/2004 | Kenney et al. |

* cited by examiner

DETERMINING THE PLACEMENT OF SEMICONDUCTOR COMPONENTS ON AN INTEGRATED CIRCUIT

CROSS REFERENCE TO RELATED APPLICATION

This application is a divisional application, which is based on and claims priority to U.S. Utility patent application Ser. No. 11/189,227, filed on Jul. 26, 2005, and which is incorporated herein by reference in its entirety.

TECHNICAL FIELD

The present application is directed to integrated circuit dies and corresponding packages for supporting the dies. More particularly, the present application is directed to systems and methods for determining the placement of semiconductor components on integrated circuit dies based on locations of interconnections between the dies and the packages.

BACKGROUND

In the field of integrated circuits, miniaturization has been a goal for circuit designers in order to increase processing speed and reduce energy consumption. As components continue to be reduced in size, the efficient utilization of the available silicon space on the semiconductor dies is an important consideration that cannot be avoided.

Another consideration in circuit design is the reliability of the interconnections between the integrated circuit die and the package that houses the die. Two interconnection techniques, in particular, stand out as the preferred techniques for such connections. A first technique is "wire-bonding" in which relatively long wires are used to electrically couple pads near an outer edge of a top surface of the die to pads on a top surface of a substrate of the package. A second technique is a "flip-chip" technique, which uses an array of short conductive leads, e.g. solder bumps, connecting the die directly to the substrate. The term "flip-chip" refers to the way in which the die is attached to the package. The die is flipped, with respect to the wire-bonding technique, such that the top of the die is attached to the substrate and the backside of the die faces away from the substrate.

Flip-chip packages offer some significant advantages over wire-bond packages. For instance, power can be supplied at the center of the die through solder bumps instead of just at the edges. This reduces the voltage drop at the center of the die without having to use long metal conductors to route the power to the center of the die. Other benefits of flip-chip packages are their relatively shorter interconnections, high frequency response, low inductance, and better signal-to-noise ratio.

Preferably, solder is used as the material of choice for making the interconnections between the flip-chip die and the substrate. Solder, for example, provides desirable conduction and processing characteristics and reliable physical strength. To mount the die on the substrate using a conventional method, solder bumps are deposited on solder wettable conductive pads on the die and an identical pattern of solder wettable pads are deposited on the substrate. Then the solder bumps on the die are aligned with the solder pads on the substrate, and the die is placed on top of the substrate, typically with an "underfill" therebetween. Then the solder is reflowed (melted) to create a good electrical and mechanical connection.

The solder that is typically used for these solder bumps consists of about 95% to 97% lead (Pb) and about 3% to 5% tin (Sn). Most lead (Pb) used in solder contains a $Pb^{210}$ isotope that naturally emits alpha particles with an energy of about 5.5 million electron volts (5.5 MeV). Solder bumps may also contain other alpha particle emitters, such as $U^{235}$, $U^{238}$, or $Th^{232}$ isotopes. In addition, other elements of the flip-chip package, such as the underfill, may also emit alpha particles. However, the majority of alpha particle emission is attributable to the solder bumps.

Alpha particles are randomly emitted from the solder bumps, or other sources, and can create electron-hole pairs in the silicon. An electron-hole pair is created when an electron is displaced from its atom and a positively charged "hole" is left in its place. Each electron-hole pair in silicon requires about 3.3 electron volts (3.3 eV) for its creation. An alpha particle having an initial energy, for example, of 5.5 MeV can create thousands of electron-hole pairs, but loses energy during electron-hole creation. If the accumulation of positive or negative charges from the electron-hole pairs reaches a certain value, the accumulated charge can change the state of a radiation-sensitive memory cell from a 0 to a 1 or vice versa. For example, these radiation-sensitive memory cells may include bit storage devices, such as storage nodes, registers, latches, etc. The bit errors in these memory cells are sometimes referred to as "soft errors", since the semiconductor component eventually returns to its original configuration and is not permanently affected. Nevertheless, soft errors degrade the integrity of the memory cells and are unacceptable. Therefore, the location of the solder bumps with respect to radiation-sensitive components is a design consideration that should normally be taken into account.

In order to reduce soft errors in the memory cells, a few solutions have been proposed in the prior art. One solution involves placing a "blocking" region in a layer adjacent to the solder bumps of the flip-chip die for blocking alpha particle radiation. The blockage region typically extends beyond the area directly under the solder bump, such that it will be large enough to block alpha particles emitted from a solder bump to such a degree that the energy of any alpha particles will predictably have the same or less chance of causing an error than the underfill. One problem with this solution, however, is that the blocking region prevents any type of semiconductor component from being placed in these locations, thereby reducing the area on the silicon that can be used for component placement. Also, placement engines in the prior art are designed to simply restrict the placement of any component at these blocked regions. This results in unusable, wasted space on the silicon.

Another prior art method for reducing soft errors is by designing the memory cells as "alpha-hardened" cells. Alpha-hardened cells contain circuitry that is better able to withstand alpha particle strikes. In this respect, a much greater energy from the alpha particles will be required to change the state of these alpha-hardened components. However, one problem with this solution is that the alpha-hardened memory elements are typically three to four times larger than normal memory elements. Also, since a circuit designer will usually not know beforehand which memory elements might be placed under the solder bumps, the designer will usually convert all memory elements to alpha-hardened elements to be safe. Since these components are larger, they will naturally take up more space on the silicon, thereby leaving less space on the silicon for additional components.

Another prior art solution to the soft error problem is the use of "low-alpha emitting solder". This type of solder can be made by removing all alpha particle emitting isotopes, such as $Pb^{210}$, from the lead. However, completely separating the radioactive isotopes from the lead in the solder bumps is both difficult and expensive. Another solution involves providing an alpha particle absorbing material. However, this too is an expensive solution.

Therefore, there is a need in the art for a better solution for reducing soft errors in memory cells, particularly a solution that overcomes the deficiencies of the prior art. Systems and methods are needed for better utilizing the space on the silicon die while reducing the number of soft errors in the memory elements and keeping material costs low. In this way, the reliability of the semiconductor device can be enhanced without extra costs.

SUMMARY

Systems and methods for determining the placement on an integrated circuit of a standard cell, representing a semiconductor component in a design stage, are disclosed herein. One embodiment of a method, among others, comprises analyzing regions of a semiconductor die with respect to the susceptibility of the region to be exposed to radiation. This method further comprises placing a standard cell in one of the analyzed regions of the semiconductor die, the standard cell being placed based on the sensitivity of the standard cell to radiation.

Another method is disclosed which includes running an algorithm, e.g. by a component placement engine, which determines the placement of semiconductor components on an integrated circuit die. The algorithm comprises determining the location of solder bumps on an integrated circuit die, computing a first set of coordinates representing high-intensity alpha particle emission regions in proximity to the solder bump locations, and computing a second set of coordinates representing a lower-intensity alpha particle emission region. The algorithm further comprises classifying components to be placed on the integrated circuit die as either memory cells or non-memory cells, placing the components classified as memory cells within the lower-intensity alpha particle emission region, and placing components not classified as memory cells within either the lower-intensity alpha particle emission region or one of the high-intensity alpha particle emission regions.

A component placement engine may be stored in memory as a software program and run by a processor. In this embodiment, the placement engine may include logic configured to determine the location of solder bumps on an integrated circuit die, determine a first set of regions including the areas on the integrated circuit die in proximity to the solder bumps, and determine a second set of regions including the areas on the integrated circuit die outside the first set of regions. The placement engine may also include logic configured to identify whether a standard cell is a storage element or a non-storage element, place the standard cell in one of the second set of regions if the standard cell is identified to be a storage element, and place the standard cell anywhere on the integrated circuit die if the standard cell is identified to be a non-storage component.

BRIEF DESCRIPTION OF THE DRAWINGS

Many aspects of the embodiments of the present disclosure can be better understood with reference to the following drawings. The components in the drawings are not necessarily to scale, emphasis instead being placed upon clearly illustrating the principles of the present disclosure. Like reference numerals designate corresponding parts throughout the several views.

DETAILED DESCRIPTION

In flip-chip technology, circuit designers take into account the fact that solder bumps emit alpha particles to nearby semiconductor components. According to the teachings of the present disclosure, a circuit designer can create a circuit that reduces alpha particle radiation effects, such as soft errors in memory cells of a flip-chip die, while utilizing the space on the silicon to the fullest extent possible and keeping the material costs low.

In the prior art, a blocking region is used which restricts the use of a large percentage of the silicon space in proximity to the solder bumps. Alternatively, the prior art uses alpha-hardened devices that are larger in size and take up more area on the silicon. Either way, silicon space is wasted. Also, more expensive materials have been used in the prior art for reducing or absorbing alpha particle emissions. However, none of these techniques utilizes the silicon space in an efficient manner using cost-effective materials.

In the present application, a design strategy is used for better utilizing the space on the silicon die. By using a placement algorithm to place "standard cells", which represent the semiconductor components in the design stage, in a manner as described herein, more space can be utilized. This placement technique puts radiation-sensitive components in locations where they are less likely to be affected by alpha particles. Components that are insensitive to alpha particle radiation can be placed anywhere on the die. A placement engine of the present disclosure determines placement based on a component's sensitivity to alpha particles. This differs from the prior art placement engines, which are not able to exclude a certain type of standard cell from a region while allowing other types of cells to be placed in that region.

The placement strategy of the present disclosure does not require any additional material costs and is therefore more cost effective than many prior art solutions. Of course, after designing the placement of the standard cells on the die during this design stage, the die can be fabricated during a fabrication stage with the semiconductor components positioned on the die according to the placement strategy for the standard cells.

Figure 1:
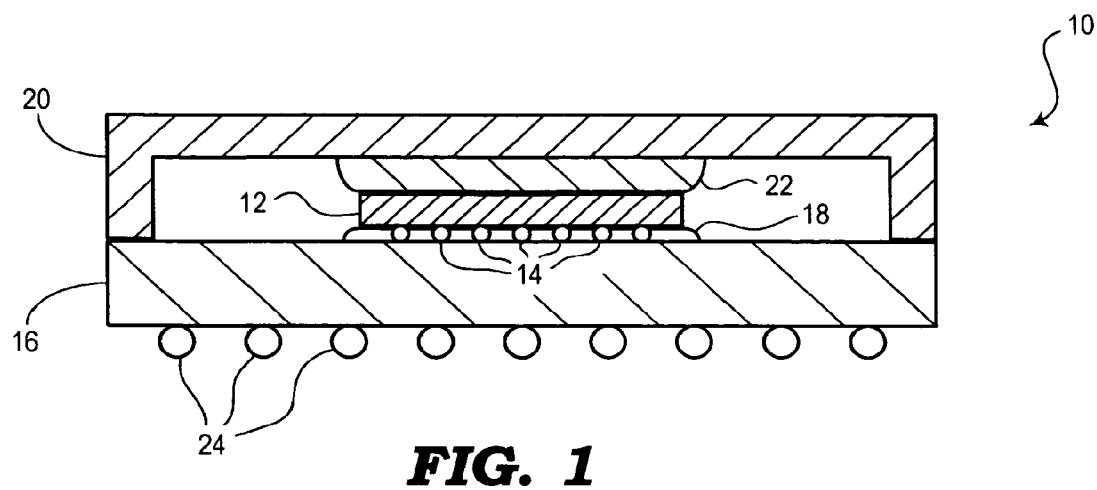
FIG. 1 is a sectional view of an embodiment of a flip-chip die attached within a package.

FIG. 1 is a sectional view of an embodiment of an integrated circuit (IC) package 10. In this embodiment, the IC package 10 includes a flip-chip die 12 having solder bumps 14 formed on a surface of the flip-chip die 12. The flip-chip die 12 may have any number of solder bumps 14. The solder bumps 14 electrically and physically connect pads or terminals on the surface of the flip-chip die 12 with pads or terminals on a surface of a substrate 16. To enhance the strength of the physical connection between the flip-chip die 12 and the substrate 16, an underfill material 18 may also be used. The IC package 10 may also include a lid 20 formed over the flip-chip die 12 to protect it from the environment. The IC package 10 may also include a thermal compound 22 applied between the flip-chip die 12 and the lid 20. The thermal compound 22 may alternatively be configured as a heatsink for dissipating heat from the flip-chip die 12.

The IC package 10, as shown in FIG. 1, is illustrated as a ball grid array (BGA) package. In this embodiment, the BGA package includes solder balls 24 for connection to a printed circuit board or other suitable circuit structure. Alternatively, the IC package 10 may be configured as a pin grid array (PGA) in which pins, in place of the solder balls 24, are used for connection to other circuitry. It should be noted that the IC package 10 may have any number or arrangement of solder balls 24 or pins and can be arranged, in addition to BGA or PGA packages, in any suitable configuration for protecting the flip-chip die 12 and electrically coupling the die 12 to external circuitry.

The present application first recognizes the fact that semiconductor components formed on the die 12 are not the same. There are components that are sensitive to alpha particles and cannot be placed in proximity to an alpha particle source. Therefore, these components can be placed far enough away from the locations of alpha particle source, such as alpha particle emitting solder bumps 14, such that the effects of the alpha particles upon the components are minimal. The components sensitive to alpha particle radiation include any structure that might be classified as a "storage element", such as memory cells, registers, latches, etc.

Also, the methods described herein include identifying those components which are tolerant of alpha particle radiation or "radiation-insensitive". Since the operation of these components is not severely affected by the alpha particles, they can be placed anywhere on the silicon and can even be placed in close proximity to the solder bumps 14, even in the areas restricted by the prior art. These radiation-insensitive components may include inverters, logic gates, etc. Even if these components were struck with an alpha particle, the effect will only be temporary and the operation of the component will not be effected.

The present application uses an improved placement engine for placing components based on their sensitivity to alpha particles. The placement engine does not include a strategy of blocking all components from certain regions as is done in the prior art, but it only blocks the radiation-sensitive components from certain regions. Also, the present placement engine places regularly sized memory elements in the circuit, not the bulky alpha-hardened components.

Figure 2:
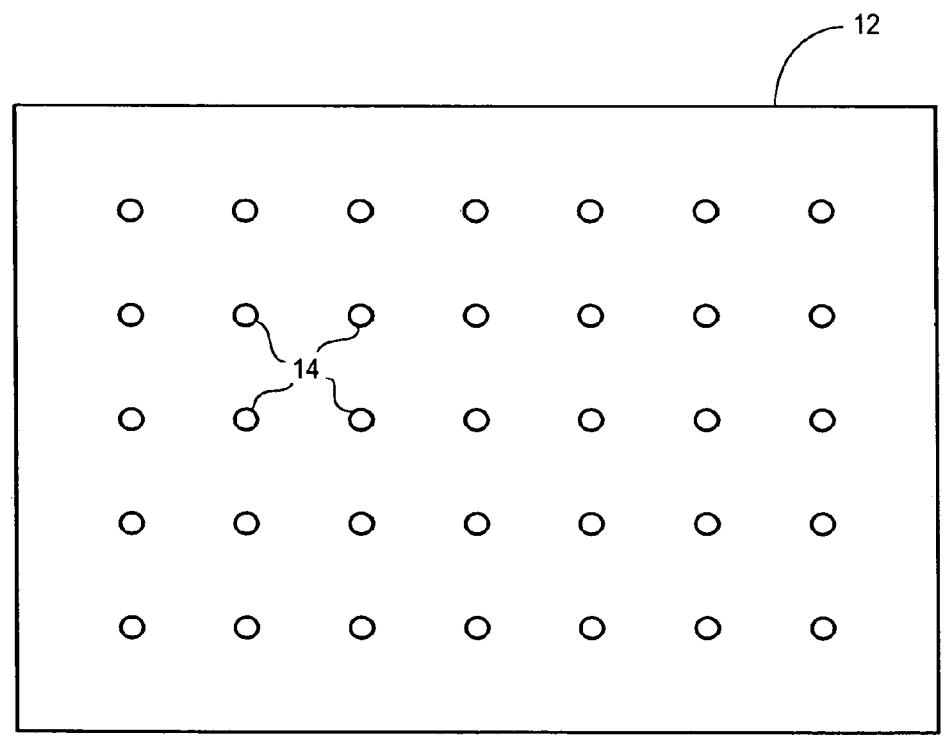
FIG. 2 is a view of an embodiment of an array of solder bumps formed on a flip-chip die.

FIG. 2 is a view of the "top" side of the flip-chip die 12 shown in FIG. 1. Typically, this side is referred to as the top side, although with flip-chip technology, the chip is "flipped" with respect to the wire-bond configuration and it is actually oriented as the bottom surface. However, the terms "top" and "bottom" are used herein to define the chip as it is shown in the drawings, but it should be noted that these orientations are used merely for illustration purposes only and can also be changed depending on how a package might be oriented in space.

FIG. 2 includes a number of solder bumps 14 arranged in an array. Although the array is shown as a 5×7 array, it should be understood that any number or any arrangement of solder bumps 14 may be formed on the top side of the flip-chip die 12.

Figure 3:
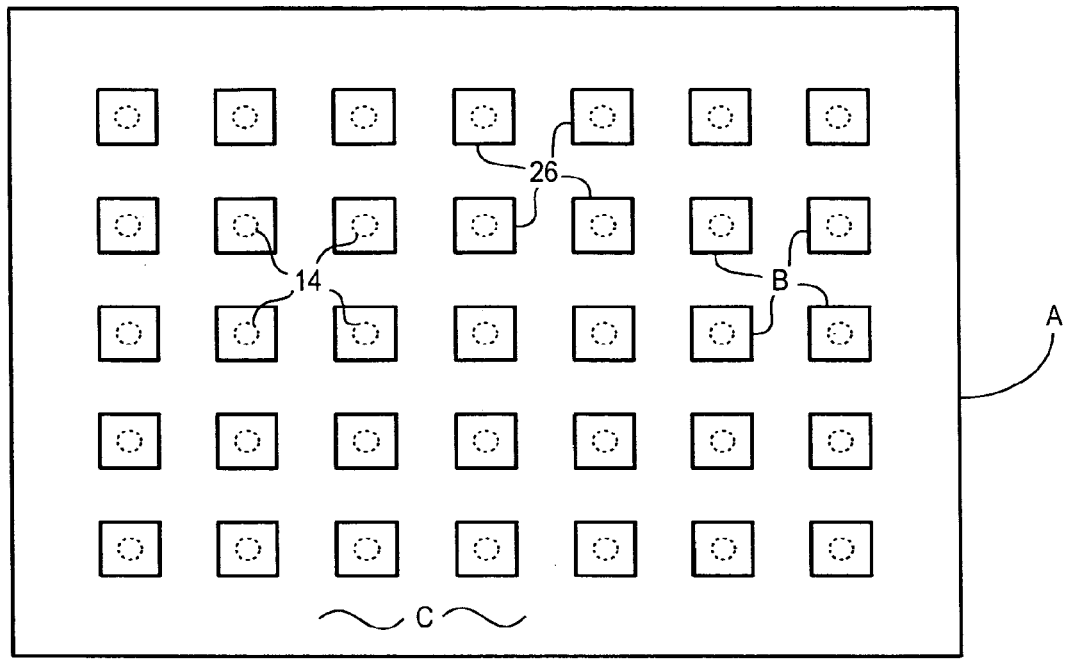
FIG. 3 illustrates high-intensity alpha particle emission regions and low-intensity alpha particle emission regions of an integrated circuit die.

FIG. 3 illustrates an example of how the component placement regions of the exemplary flip-chip die 12 of FIG. 2 can be divided. The regions are divided according to susceptibility to different intensities of alpha particle radiation. The size of these regions may be calculated based on knowledge of the alpha particle energy, possible trajectories of the alpha particles, and the reduction in energy of the particles as they travel further from the source. In this example, regions 26 around the locations of the solder bumps 14 are designated as high-intensity alpha particle emission regions B. All other areas of the die, equal to the entire region A of the die 12 minus the high-intensity alpha particle emission regions B, are designated as low-intensity alpha particle emission regions C. Region C may be considered as a single region or a number of adjoining regions. In the present application, a placement engine can place radiation insensitive cells anywhere in region A, including region B, while sensitive cells are placed in region C. The region B might be substantially similar to the previously unused space in the prior art having the blocking region, which restricts the placement of any components in that space.

In this example, the regions are rectangular in shape. However, it should be noted that the shapes can be circular shapes concentric with the solder bump locations, or any other suitable shape for establishing a proper boundary between areas that might likely experience a high volume of alpha particle strikes and areas that might experience a relatively low volume of strikes.

In an alternative embodiment, a different pattern of regions can be established in which more than two types of regions can designate more than two intensity levels. For example, in this alternative embodiment, the regions may be divided according to several levels of susceptibility to alpha particle strikes. Instead of only high intensity regions and low intensity regions, the regions may include any number and arrangement of intensity levels. The terms "high" and "low" in this context are relative terms and may be dependent upon various factors related to the size and composition of the solder bumps, energy absorption characteristics of the silicon material, sensitivity of various semiconductor components, and other factors as can be measured or predicted using statistical analysis as will be understood by one of ordinary skill in the art.

Figure 4:
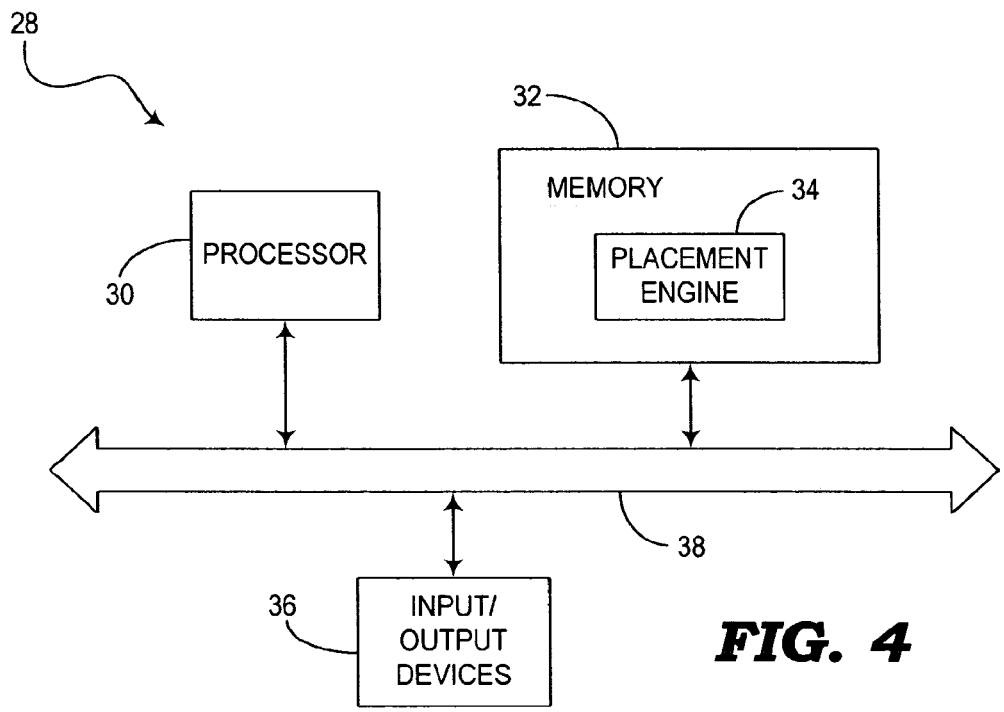
FIG. 4 is a block diagram of an embodiment of a computer system for determining the placement of standard cells on an integrated circuit die.

FIG. 4 is a block diagram of an embodiment of a computer system 28 for placing standard cells on an integrated circuit die during a design stage. The computer system 28 comprises a processor 30, memory 32 having a placement engine 34 stored therein, and input/output (I/O) devices 36. The processor 30, memory 32, and I/O devices 36 are in communication with each other via local interface 38, which may be a wired or wireless interface. The placement engine 34 stored in memory 32 can contain software, source code, or the like, for determining the placement of "radiation-sensitive" and "radiation-insensitive" components on an integrated circuit die. The placement engine includes functions for distinguishing between the sensitive and insensitive components, placing sensitive components in certain regions on the die, and placing insensitive components in any region.

A user, such as a circuit designer, can interact with the computer system 28 using the input/output devices 36, which may comprises, for instance, keyboards, keypads, monitors, etc. The user may enter characteristics of the location and size of the solder bumps on the flip-chip die. The user may also enter other parameters, such as the composition of the solder being used for the solder bumps, sensitivity of the standard cells to alpha particle radiation, or other information useful for determining acceptable regions on the die for the radiation-sensitive components.

Particularly, the placement engine 34 may be configured to perform certain functions in order to properly position the standard cells on the die based on the cell's sensitivity to alpha particles. For example, the placement engine 34 may determine where the solder bumps have been placed or extract this information from data entered by the user. The placement engine 34 may also compute the coordinates of a first set of regions, such as regions B (FIG. 3) surrounding the solder bump locations, and a second set of regions C that include all other available space. Also, the placement engine 34 analyzes the components to distinguish between sensitive and insensitive components. Then, the placement engine 34 places the components based on alpha particle sensitivity. The placement of "memory cells" or other components sensitive to alpha particle radiation will be restricted to the second set of regions C since placement in proximity to an alpha particle source may induce a greater number of soft errors. Insensitive components can be arbitrarily placed anywhere in region A, even within region B. Insensitive components, such as non-storage type cells, are not restricted from the B regions, where alpha particle emission is more intense, since these components are not adversely affected by alpha particle radiation.

The placement engine 34 can be a stand-alone program or can be an add-on routine or sub-routine to supplement other component placement software, which can also be stored in memory 32. The placement engine 34 conforms with industry standard placement and routing engines, thereby saving time for the users of the placement engine 34, i.e. circuit designers.

The placement engine 34 of the present disclosure can be implemented in hardware, software, firmware, or a combination thereof. In the disclosed embodiments, the placement engine 34 is implemented in software or firmware that is stored in a memory, e.g. memory 32, and that is executed by a suitable instruction execution system, e.g. processor 30. If implemented in hardware, as in an alternative embodiment, the placement engine 34 can be implemented with any combination of discrete logic circuit elements for implementing logic functions.

The placement engine 34 can comprise a placement algorithm or computer program, which comprises an ordered listing of executable instructions for implementing logical functions. The algorithm or program can be embodied in any "computer-readable medium" for use by an instruction execution system or device, such as a computer-based or processor-based system. In the context of this document, a computer-readable medium can be any medium that can contain, store, communicate, propagate, or transport the placement program for execution by the processor 30 or other suitable instruction execution system or device and can be stored in an electronic, magnetic, optical, or other suitable format. The computer-readable medium may include a computer diskette, random access memory (RAM) element, read-only memory (ROM) element, programmable read-only memory (PROM) element, flash memory, compact disc read-only memory (CDROM), or other suitable memory element.

Figure 5:
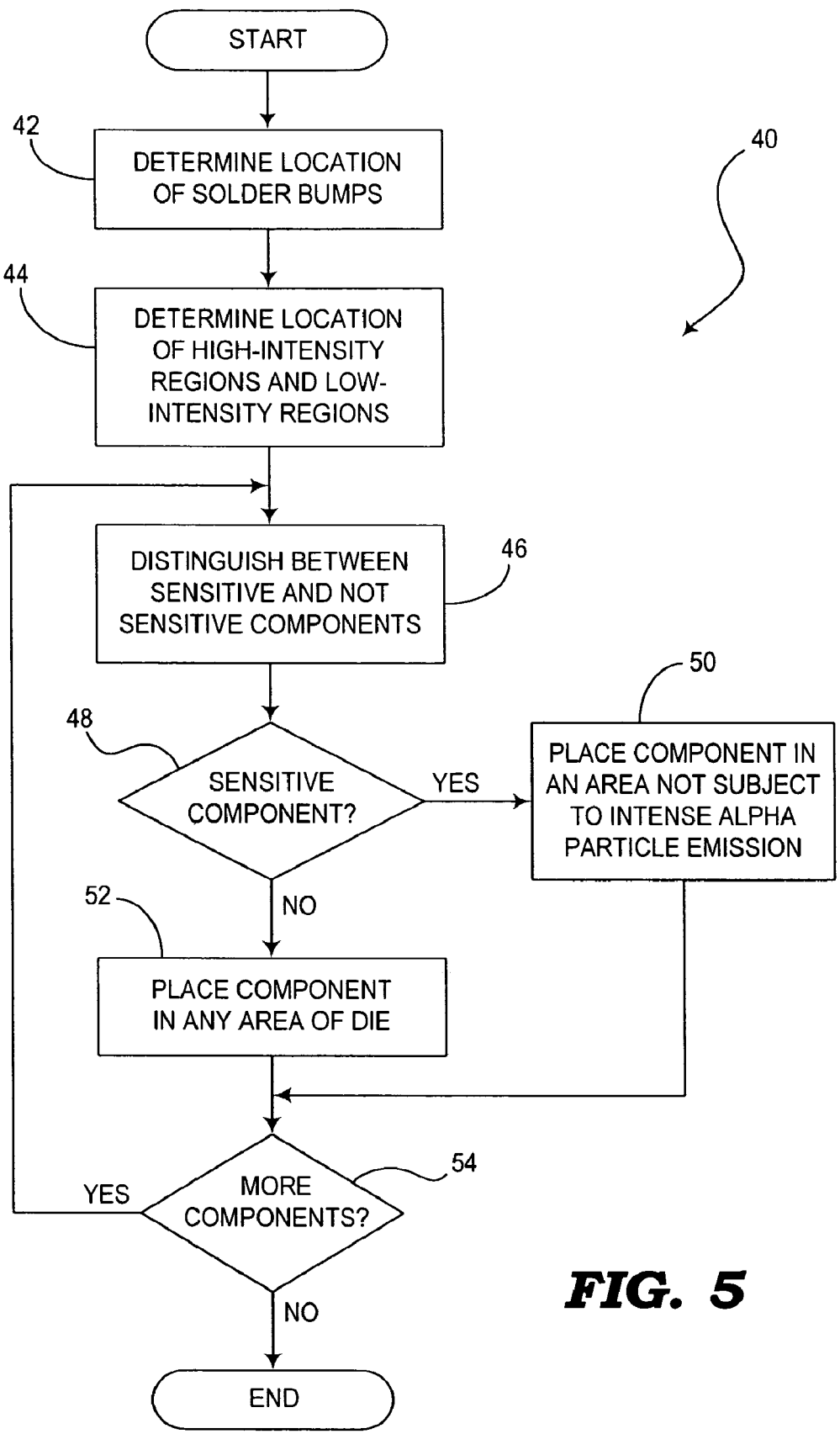
FIG. 5 is a flow chart of an embodiment of a process for determining the placement of standard cells on an integrated circuit die.

FIG. 5 is a flow chart of an embodiment of a placement algorithm 40, or placement sub-routine, for placing semiconductor components on an integrated circuit die. The placement algorithm 40 may correspond to the functionality described with respect to the placement engine 34 shown in FIG. 4. The placement algorithm 40 may be used during a design stage for placing standard cells, representing semiconductor components, on an integrated circuit die.

The placement algorithm 40 includes a first block 42 for determining the location of the solder bumps on a flip-chip die on which standard cells are to be placed. Block 42 may comprise receiving data entry from a circuit designer regarding the location of the solder bumps.

Block 44 includes determining the location of regions of the silicon die that are high-intensity alpha particle emission regions and the location of regions that are low-intensity regions. Determining these regions may further comprise computing coordinates for defining the boundaries of the regions. Alternatively, block 44 may further comprise determining one or more additional regions of alpha particle intensity. In this alternative aspect of block 44, the placement algorithm 40 may be configured to determine any number of intensity level regions.

Block 46 comprises analyzing a component, such as a standard cell, to determine whether or not the component is sensitive to alpha particle radiation. This block may also classify the component as a memory element, which is typically alpha sensitive, or a non-memory element, which is typically not alpha sensitive. Alternatively, block 46 may further comprise analyzing one of multiple different intensity ranges that standard cells may be able to handle without experiencing errors, corresponding to the alternative embodiments of multiple regions defined with respect to block 44, if available.

Decision block 48 determines whether or not the component analyzed in block 46 is a sensitive component, i.e. sensitive to alpha particle radiation. If so, flow proceeds to block 50, where the component is placed in a low-intensity alpha particle emission region as defined with respect to block 44. This region includes any area that is not subject to intense alpha particle emission, e.g. region C. If it is determined in decision block 48 that the component is not a sensitive component, then flow proceeds to block 52, where the radiation insensitive component is placed in any area of the die, e.g. region A. From block 50 and 52, flow proceeds to block 54. In decision block 54, it is determined whether or not any more components are to be added to the die. If so, then flow loops back to block 46 to handle the placement of the next component. If no more components are to be placed, then the placement algorithm 40 ends.

It should be noted that if more than two regions are established in block 44 for multiple alpha particle intensity levels, then blocks 46, 48, 50, and 52 can be altered accordingly to accommodate the placement of components into respective regions according to the component's sensitivity to alpha particles.

The flow chart of FIG. 5 shows the architecture, functionality, and operation of possible implementations of the placement engine software. In this regard, each block represents a module, segment, or portion of code, which comprises one or more executable instructions for implementing the specified logical function(s). It should also be noted that in some alternative implementations, the functions noted in the blocks may be executed out of the order noted in FIG. 5, may be executed substantially concurrently, or may be executed in a reverse order, if possible, depending upon the functionality involved, as would be understood by those having reasonable skill in the art.

As a result, the present disclosure provides an efficient component placement strategy that better utilizes silicon areas, including space that was previously unused in the prior art. The present disclosure also teaches the utilization of smaller design components that take up less space on the silicon real estate instead of larger alpha-hardened components. In this manner, the present disclosure is able to keep material costs low without compromising the integrity of the die. And by placing radiation-sensitive components offset from the locations of the solder bumps, the likelihood of soft errors in the components can be minimized.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

We claim:

1. A semiconductor device, comprising:
   a semiconductor die;
   an array of solder bumps formed on a surface of the semiconductor die;
   a plurality of radiation susceptibility regions mapped in correspondence to the location of the array of solder bumps on the semiconductor die;
   a first region surrounding a first solder bump in the array of solder bumps, wherein the first region is a region that is susceptible to radiation emitted from solder deposited on the first solder bump;
   a radiation-insensitive standard cell located inside the first region; and
   a radiation-sensitive standard cell located outside the first region;
   wherein the radiation susceptibility region is mapped at the design state prior to the placement of the radiation-insensitive standard cell and the radiation-sensitive standard cell.

2. The device of claim 1, wherein the first region comprises a concentric area surrounding the first solder bump.

3. The device of claim 1, wherein the first region comprises a rectangular area surrounding the first solder bump.

4. The device of claim 1, wherein the first region comprises an adjacent area surrounding the first solder bump.

5. The device of claim 1, wherein the radiation susceptibility region comprises of more than one radiation sensitivity level.

6. The device of claim 5, wherein a radiation sensitivity level is determined at least based on the alpha particle energy of the solder bumps, possible trajectories of the alpha particles, and a reduction pattern in energy of alpha particles as they travel further from a solder bump.

7. The device of claim 1, wherein the size of the first region is determined based on knowledge of the alpha particle energy of the solder bumps, possible trajectories of the alpha particles and a reduction in energy of the alpha particles as they travel further from a solder bump.

8. The device of claim 1, wherein the radiation-sensitive standard cell is a memory cell.

9. The device of claim 1, where the radiation-insensitive standard cell is a non-memory cell.

10. A semiconductor device, comprising:
    a semiconductor die;
    an array of solder bumps formed on a surface of the semiconductor die;
    a plurality of radiation susceptibility regions mapped in correspondence to the location of the array of solder bumps on the semiconductor die;
    at least two regions surrounding each solder bump in the array of solder bumps, wherein the at least two regions designate at least two energy intensity levels, wherein the at least two energy intensity levels are divided according to levels of susceptibility to alpha particle strikes;
    a radiation-insensitive standard cell located inside a region of higher energy intensity; and
    a radiation-sensitive standard cell located outside regions of higher energy intensity;
        wherein the radiation susceptibility region is mapped at the design state prior to the placement of the radiation-insensitive standard cell and the radiation-sensitive standard cell.

* * * * *